(12) United States Patent
Audet

(10) Patent No.: US 9,634,173 B2
(45) Date of Patent: Apr. 25, 2017

(54) PHOTODETECTOR FOR DETERMINING LIGHT WAVELENGTHS

(75) Inventor: Yves Audet, Montreal (CA)

(73) Assignee: Polyvalor, Limited Partnership, Montreal (CA)

( * ) Notice: Subject to any disclaimer, the term of this patent is extended or adjusted under 35 U.S.C. 154(b) by 0 days.

(21) Appl. No.: 13/811,832

(22) PCT Filed: Jul. 26, 2011

(86) PCT No.: PCT/CA2011/050460
§ 371 (c)(1),
(2), (4) Date: Jan. 23, 2013

(87) PCT Pub. No.: WO2012/012900
PCT Pub. Date: Feb. 2, 2012

(65) Prior Publication Data
US 2013/0120751 A1 May 16, 2013

Related U.S. Application Data

(60) Provisional application No. 61/367,616, filed on Jul. 26, 2010.

(51) Int. Cl.
H01L 27/148 (2006.01)
H01L 31/101 (2006.01)
(Continued)

(52) U.S. Cl.
CPC ............ H01L 31/101 (2013.01); B82Y 20/00 (2013.01); G01J 3/2803 (2013.01); G01J 3/50 (2013.01);
(Continued)

(58) Field of Classification Search
CPC ......... H01L 27/14645; H01L 27/14647; H01L 27/14667; H01L 31/1013
(Continued)

(56) References Cited

U.S. PATENT DOCUMENTS 4,433,343 A * 2/1984 Levine .............. H01L 27/14649
257/290
4,800,415 A 1/1989 Simmons et al.
(Continued)

FOREIGN PATENT DOCUMENTS

WO WO2007/140602 * 12/2007 ............. H04N 5/335

OTHER PUBLICATIONS

International Search Report mailed on Oct. 19, 2011 in connection with International Patent Application No. PCT/CA2011/050460, 4 pages.

*Primary Examiner* — Jesse Y Miyoshi
(74) *Attorney, Agent, or Firm* — Norton Rose Fulbright Canada LLP

(57) ABSTRACT

There is described a photodetector comprising a semiconductor material having at least a region substantially depleted of free moving carriers, the photodetector comprising: a substrate of one of n-type and p-type; at least one charge collector along a surface of the substrate and having a doping-type opposite from the substrate; a substrate contact along the surface of the substrate spaced apart from the at least one charge collector to allow current to flow between the at least one charge collector and the substrate contact; and at least one non-conductive electrode positioned along the surface of the substrate in an alternating sequence with the at least one charge collector, and separated from the substrate by an insulator, and adapted to apply an electric potential to the substrate and cause charge carriers generated therein by application of a light source to advance towards the at least one charge collector due to the effects of an electric field, such that the at least one charge collector can measure carrier concentration within the substrate.

10 Claims, 10 Drawing Sheets

(51) Int. Cl.
*H01L 27/146* (2006.01)
*B82Y 20/00* (2011.01)
*G01J 3/28* (2006.01)
*G01J 3/50* (2006.01)
*H01L 31/0352* (2006.01)
*H01L 31/103* (2006.01)
*H04N 9/04* (2006.01)

(52) U.S. Cl.
CPC ...... *H01L 27/1461* (2013.01); *H01L 27/1463* (2013.01); *H01L 27/14601* (2013.01); *H01L 27/14643* (2013.01); *H01L 27/14645* (2013.01); *H01L 27/14647* (2013.01); *H01L 31/035236* (2013.01); *H01L 31/103* (2013.01); *H01L 31/1013* (2013.01); *H04N 9/045* (2013.01); *H04N 2209/047* (2013.01)

(58) Field of Classification Search
USPC ......... 257/439, 440, 448, E27.134, E27.135, 257/E31.054
See application file for complete search history.

(56) References Cited

U.S. PATENT DOCUMENTS

| | | |
|---|---|---|
| 5,886,353 A | 3/1999 | Spivey et al. |
| 6,040,592 A | 3/2000 | McDaniel et al. |
| 6,111,300 A | 8/2000 | Cao et al. |
| 6,114,739 A | 9/2000 | Theil et al. |
| 6,127,697 A | 10/2000 | Guidash |
| 6,455,833 B1 * | 9/2002 | Berezin ............... 250/208.1 |
| 6,587,146 B1 | 7/2003 | Guidash |
| 6,737,624 B1 | 5/2004 | Toma |
| 6,930,299 B2 | 8/2005 | Ohkawa |
| 7,132,724 B1 * | 11/2006 | Merrill ............ H01L 27/14647 257/440 |
| 8,106,348 B2 * | 1/2012 | Audet ............. H01L 27/14647 250/208.1 |
| 2002/0171881 A1 | 11/2002 | Merrill et al. |
| 2004/0041932 A1 | 3/2004 | Chao et al. |
| 2006/0128087 A1 | 6/2006 | Bamji et al. |
| 2007/0102778 A1 * | 5/2007 | Tishin et al. ............. 257/440 |
| 2007/0218580 A1 * | 9/2007 | Hsu et al. ................ 438/48 |

* cited by examiner

PHOTODETECTOR FOR DETERMINING LIGHT WAVELENGTHS

CROSS-REFERENCE TO RELATED APPLICATIONS

This application claims priority under 35 U.S.C. §119(e) from U.S. Provisional Patent Application No. 61/367,616, filed on Jul. 26, 2010, the contents of which are hereby incorporated by reference.

TECHNICAL FIELD

The present invention relates to the field of photodetectors, such as those used as pixels in digital cameras or in spectrometers.

BACKGROUND OF THE ART

Imaging technologies are rapidly evolving, given the increasing presence of imaging in fields such as security, transportation, health, industrial processes, communications, art, etc. Digital cameras are now present by default on many common consumer products, such as laptop computers, telephones, and others.

While the quality of images has increased and the cost of cameras has decreased, improvements are still necessary. In particular, for applications that require specific wavelengths in ultra-violet to infrared range (such as night vision), existing technologies have been pushed to their limits.

SUMMARY

Color detection is a low accuracy spectral analysis of a given electromagnetic signal in the visible band. Therefore, the present description is presented from the general perspective of wavelength detection, and is applied to three main applications, namely the spectrometer, the spectral image sensor and the color image sensor.

In accordance with a first broad aspect, there is provided a photodetector comprising a semiconductor material having at least a region substantially depleted of free moving carriers, the photodetector comprising: a substrate of one of n-type and p-type; at least one charge collector along a surface of the substrate and having a doping-type opposite from the substrate; a substrate contact along the surface of the substrate spaced apart from the at least one charge collector to allow current to flow between the at least one charge collector and the substrate contact; and at least one non-conductive electrode positioned along the surface of the substrate in an alternating sequence with the at least one charge collector, and separated from the substrate by an insulator, and adapted to apply an electric potential to the substrate and cause charge carriers generated therein by application of a light source to advance towards the at least one charge collector due to the effects of an electric field, such that the at least one charge collector can measure carrier concentration within the substrate.

The photodetector may be used within a spectrometer, in combination with a photodetector circuit connected to the photodetector for addressing, reading, and operating the at least one charge collector and the at least one non-conductive electrode; an analog to digital circuit to convert carrier concentration measurements to digital signals; and a digital processing unit to extract at least one of wavelengths and colors from the digital signal.

An array of such photodetectors may be used to form a spectral imaging sensor, in combination with a photodetector circuit connected to the array of photodetectors for addressing, reading, and operating the two charge collectors and the two non-conductive electrodes of each photodetector; an analog to digital circuit to convert carrier concentration measurements to digital signals; and a digital processing unit to extract at least one of wavelengths and colors from the digital signals. In this case, for each photodetector of the array, the at least one charge collector comprises two charge collectors, the at least one non-conductive electrode comprises two non-conductive electrodes, and varying electric potentials are applied to the two non-conductive electrodes.

An array of such photodetectors may also be used to form a color imaging sensor, in combination with photodetector circuit connected to the photodetector for addressing, reading, and operating the two charge collectors and the two non-conductive electrodes of each photodetector; an analog to digital circuit to convert carrier concentration measurements to digital signals; and a digital processing unit to extract colors from the digital signals and convert the colors to an RGB format. In this case, for each photodetector of the array, the at least one charge collector comprises two charge collectors, the at least one non-conductive electrode comprises two non-conductive electrodes, and constant electric potentials are applied to the two non-conductive electrodes.

In accordance with a another broad aspect, there is provided a method for determining a wavelength of light using a photodetector, the photodetector having a substrate with at least a region substantially depleted of free moving carriers, at least one charge collector, and at least one non-conductive electrode, the method comprising: generating charge carriers in the region by applying a light source; applying an electric potential to the at least one non-conductive electrode to modify an electric field present inside the substrate and redirect the charge carriers towards the at least one charge collector; measuring carrier concentration at the at least one charge collector as a function of depth in the substrate; and determining wavelength using the carrier concentration as a function of depth.

In this specification, the term "charge carrier" is intended to mean either a hole or an electron. Hole-electron pairs are created and the collected carriers will depend on the nature of the PN junction, i.e. whether it is a p-doped substrate or an n-doped substrate. While the description uses a P-substrate with N-wells and N-implants, it should be understood that an N-substrate with P-wells and P-implants would apply as well.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION

The principle of wavelength dependency on electromagnetic radiation absorption in semiconductor materials is used to determine the wavelength of a light source. This effect is quantitatively described by the absorption depth parameter, α, indicating at which distance from the surface the incoming light intensity traveling through is reduced by 1/e (0.368). This parameter is a function of the radiation wavelength and the material.

Figure 1:
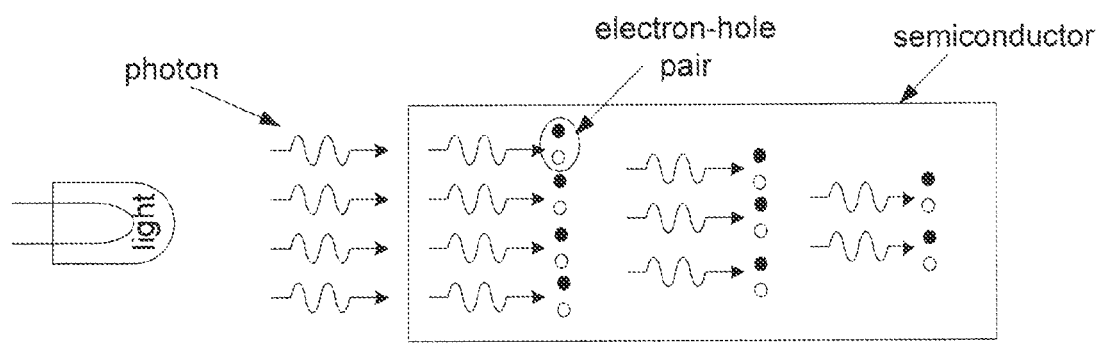
FIG. 1 illustrates the absorption phenomenon in semiconductor materials.

As shown in FIG. 1, in semiconductor materials, absorption involves photons that, when colliding with electrons in the valence band, transfer their energy to the electrons, liberating them from covalent bonds and thus creating electron-hole pairs.

In the presence of carrier generation in the depletion region of a semiconductor from a monochromatic light signal, and assuming that every absorbed photon generates one electron-hole pair, the carrier concentration distribution as a function of the distance in the material from the illuminated surface, y, follows the relation $$\delta_e(y) = I_\lambda e^{-\alpha \lambda y}, \quad (1)$$

where $\delta_e(y)$ is the generated electron concentration, $I_\lambda$ is the intensity of the light signal (photon/cm$^2$-s) at the surface of the semiconductor and $\alpha_\lambda$ is the absorption coefficient which is material and wavelength dependent. This relationship assumes that there is no reflectivity at the surface of the material, so the entire signal intensity, $I_\lambda$, penetrates into the semiconductor. When the light signal is polychromatic, the contribution of the electron generation from different wavelengths is additive, so the resulting electron concentration is given by $$\delta_e(y) = I_{\lambda 1} e^{-\alpha \lambda 1 y} + I_{\lambda 2} e^{-\alpha \lambda 2 y} + \ldots I_{\lambda N} e^{-\alpha \lambda N y}, \quad (2)$$

where $I_{\lambda 1}, I_{\lambda 2}, \ldots I_{\lambda N}$ are the intensities of the different wavelength contributions and $\alpha_{\lambda 1}, \alpha_{\lambda N}$ are the corresponding absorption coefficients. Hence, from equation (2), it can be deduced that the shape of the electron concentration is dependent on the wavelength content of the incident light.

Figure 2:
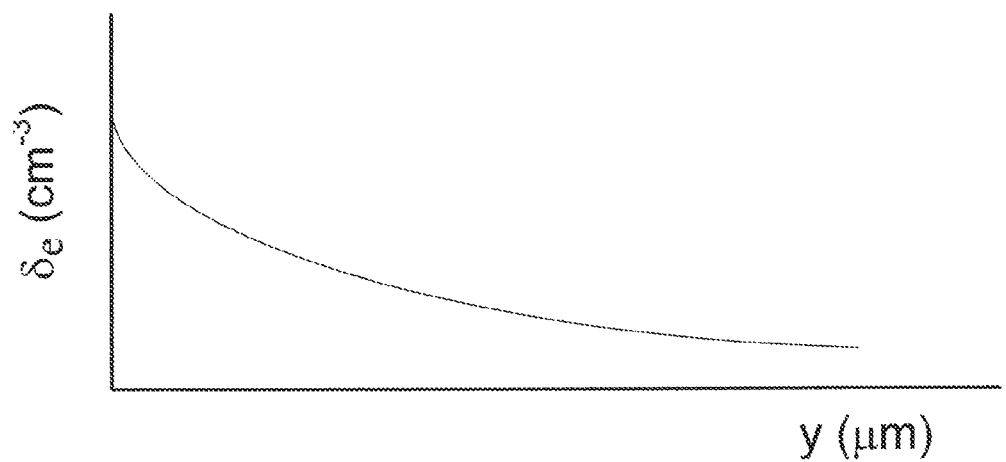
FIG. 2 is an example curve $\delta_e(y)$ for electron concentration distribution as a function of depth in the material.

The concentration of the generated electrons $\delta_e(y)$ (as a function of depth y) in the material is presented in the graph of FIG. 2. The curve trend is directly linked to the wavelength spectrum of the incoming electromagnetic radiation traveling through the material. A method for measuring the curve $\delta_e(y)$ will be described in more detail below.

Without light excitation, intrinsic semiconductor materials at room temperature also contain electron-hole pairs due to thermal generation. However, intrinsic semiconductor materials are rarely seen in integrated circuit fabrication processes. In fact these processes, like the CMOS process, use semiconductor materials where free electrons or holes are intentionally added during a fabrication step called doping. For the generation curve $\delta_e(y)$ to be noticeable, the volume where the electron-hole pairs are generated has to be depleted from free moving carriers that are created thermally or have been added by doping.

One way to obtain a carrier depletion region is by fabricating a PN junction. A PN junction is characterized by a region where a semiconductor enhanced with holes by doping (P-type) is in contact with a semiconductor enhanced with electrons (N-type). This electron-hole proximity forces the electrons to recombine with holes and leave behind a volume without carriers, called a carrier depleted region or simply a depletion region. The electron-hole recombination process stops when the depletion region has reached a critical size that prevents further recombination due to the built-in electric field. Applying externally a reverse biasing voltage to the PN junction increases the volume of the depletion region.

Figure 3:
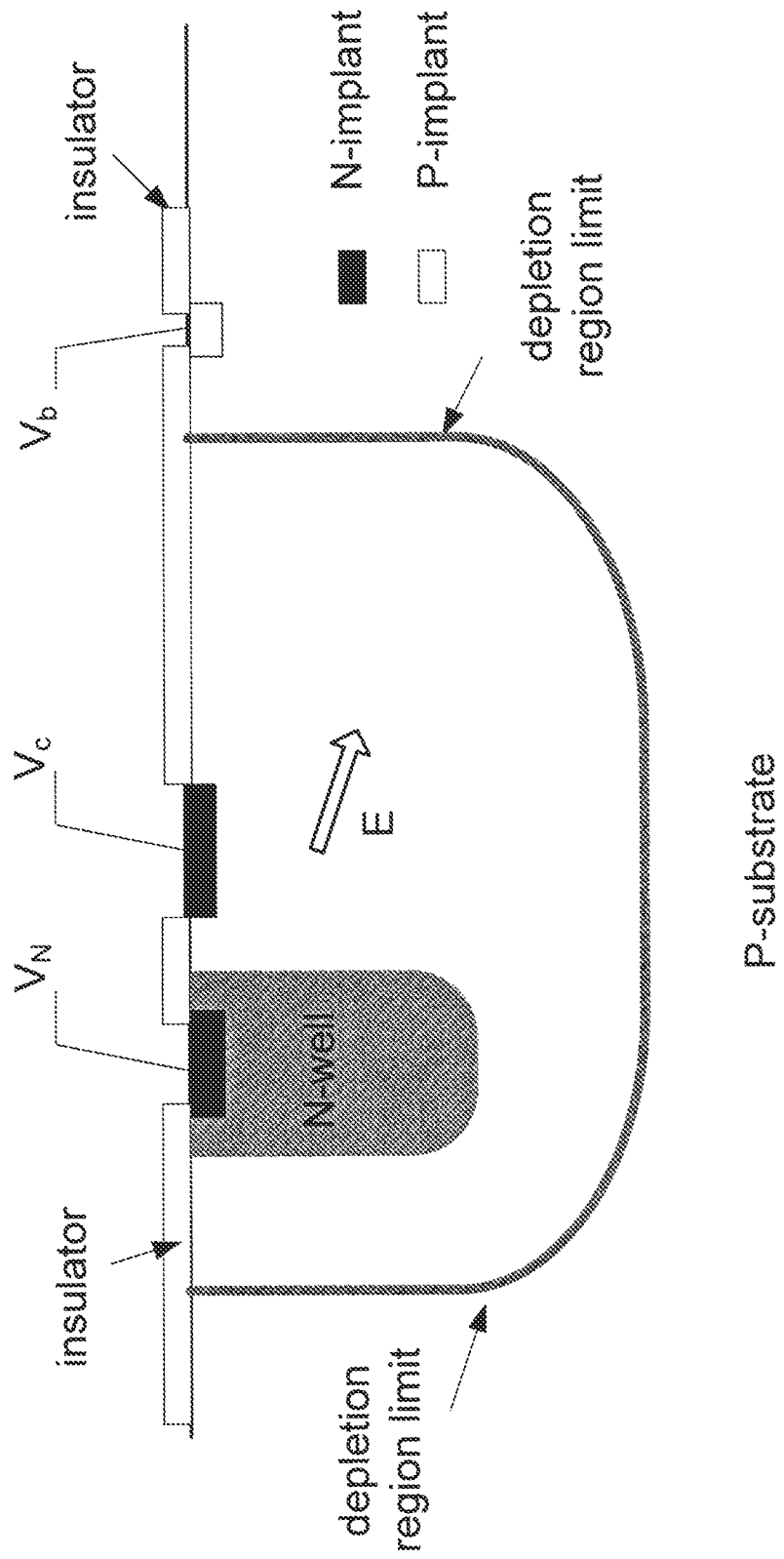
FIG. 3 is an example of a depletion region in a structure formed by a CMOS process.

FIG. 3 illustrates a depletion region realized from standard doped structures available in CMOS processes. On the left, from a P-doped substrate, an N-doped well with a higher concentration creates a depletion region that extends mainly in the substrate up to the depletion region limit line. On the right, the depletion region extent is due to the PN junction formed by the P-substrate and the N-well. The implants are small highly doped regions that are employed to configure drains and sources of MOS transistors. The P-implant is used to ensure a good electrical contact for the P-substrate. The length of the depletion region on the right is controlled by the voltage difference between the N-well and the P-substrate ($V_N - V_b$).

Figure 4:
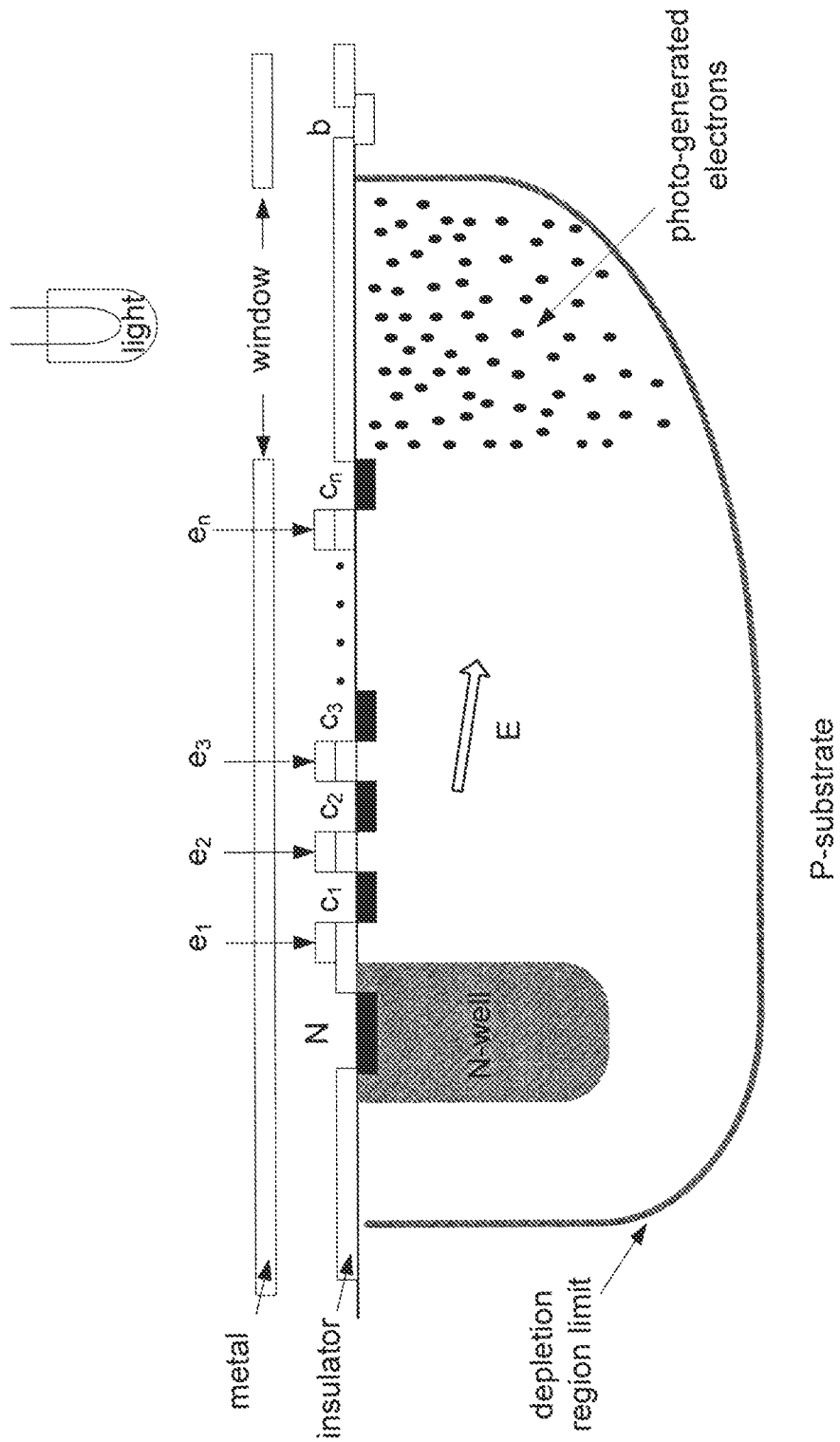
FIG. 4 is an exemplary embodiment of a photodetector and its layer structure.

A series of small N-implants are used to measure the carrier concentration, $\delta_e(y)$, generated in the depletion region. FIG. 4 illustrates an exemplary structure employed for this measurement. Assuming the electric field, E, points diagonally from the N-well to the P-substrate, the amount of carriers collected by each collector ($C_1$ to $C_n$) and the N-well will depend on its position. Collector $C_n$, being adjacent to the window opening, will collect electrons generated close to the surface. Collectors further away from the window, $c_1$ to $c_{n-1}$, will collect electrons generated deeper in the substrate down to the lower limit of the depletion region. Each collector and the well determine one point of the curve $\delta_e(y)$.

An issue arises from having two collectors close by and surrounded by a depletion region. Similar to the DIBL (Drain induced Barrier Lowering) effect observed on MOS transistors, it is likely that the whole row of collectors will be short-circuited. This effect comes from a diminished potential barrier between the collectors caused by the short depletion region separating them. To prevent this effect, non-conductive electrodes ($e_1$ to $e_{n-1}$) are inserted between the collectors. These electrodes, shown in FIG. 4, may be made of metal or polysilicon for a CMOS process and are separated from the substrate by an insulator. Therefore, they do not collect any charge and by connecting them to an electrical potential, they modify the electric field in the substrate between the collectors and the well to prevent the short-circuit effect. Also, they provide two additional features: 1) they modify the electric field orientation within the depletion region in order to get the diagonal trajectories of the carriers from the window area to the collectors and 2)

they enable hole accumulation around the collectors in order to fill the trap centers at the substrate-insulator interface and then reduce the dark current.

Figure 5:
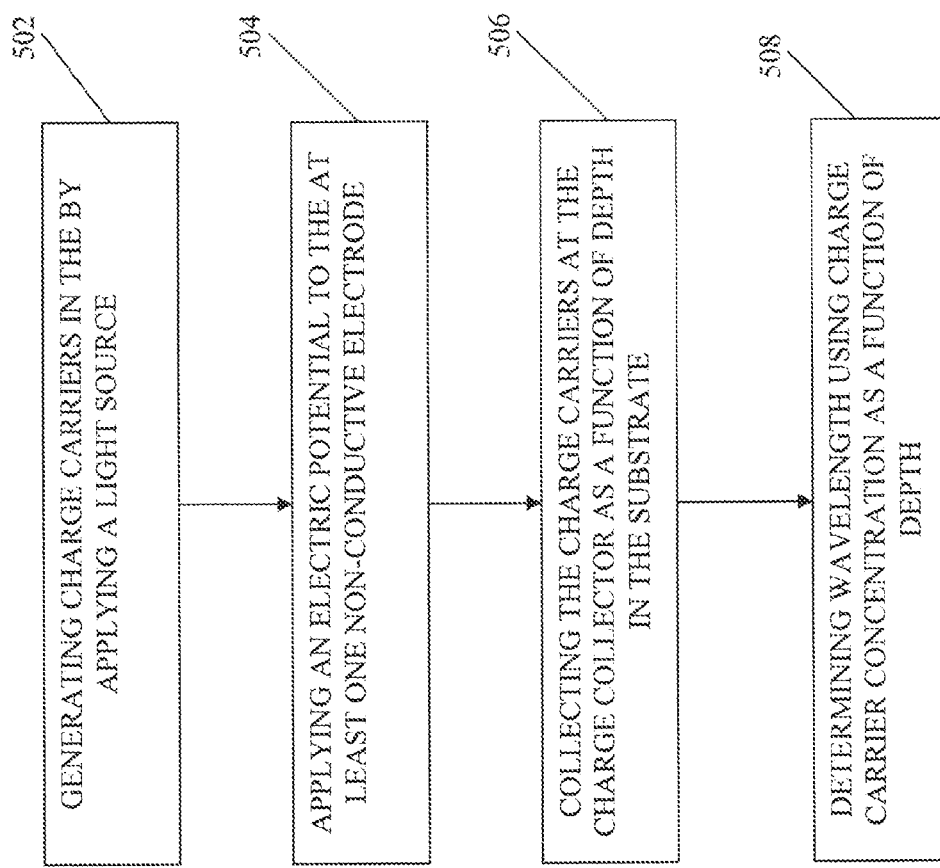
FIG. 5 is a flowchart of an exemplary embodiment for a method of determining a light wavelength using a photodetector.

FIG. 5 illustrates a flowchart for a method of determining light wavelength using the photodetector of FIG. 4. In a first step, a light source is applied to the photodetector in order to generate the carriers in the depletion region 502. An electric potential is applied to the electrodes $e_1$ to $e_{n-1}$ 504. The potential may be applied before, during, or after application of the light source. This potential acts to modify the direction of the electric field in the depletion region. The charge carriers are collected by the charge collectors 506 and the well. Using the measured current from the charge collectors and the well, the photo-generated carrier concentration $\delta_e(y)$ is found. The last step is therefore to determine wavelength using the carrier concentration $\delta_e(y)$ 508.

Figure 6:
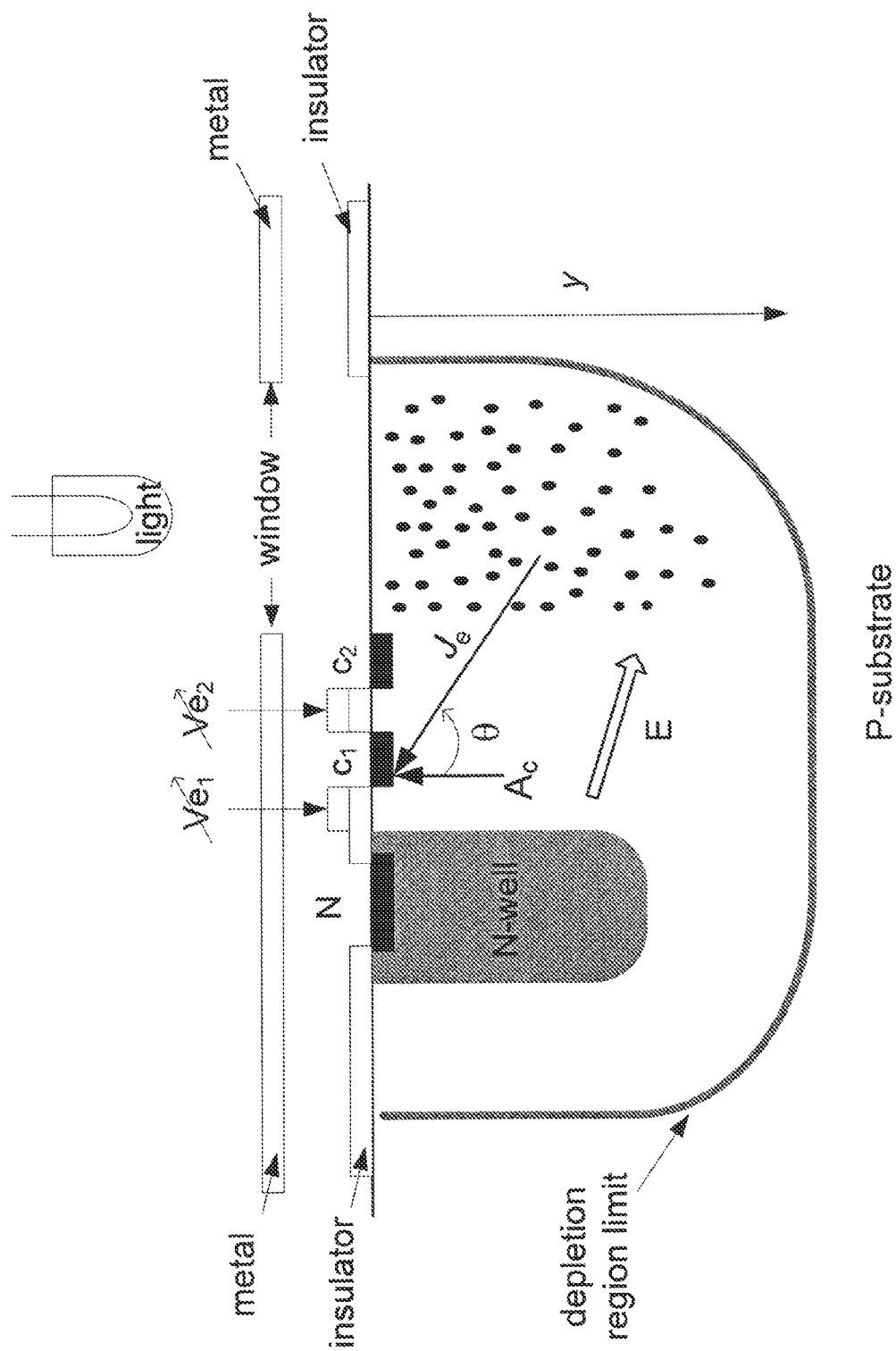
FIG. 6 is an exemplary embodiment of the photodetector of FIG. 4 with variable electrode voltages, for an application of spectrometry.

With respect to FIG. 6, collector $c_1$ gives a current, $I_{c1}$, that is the result of the scalar product between the current density vector, $\vec{J}_e(y)$, and the area vector perpendicular to the collector surface, $\vec{A}_c$, $$I_{C2} = J_e(y) A_c \cos \theta, \quad (3)$$

where $\theta$ is the angle between $\vec{J}_e(y)$ and $\vec{A}_c$.

Measuring current density from different depths may be done by having a plurality of charge collectors spaced apart, the position of each charge collector being determinant in collecting charge carriers of a given depth. An alternative to this embodiment is having a low number of charge collectors and varying the electrode voltages, $V_{e1}$ and $V_{e2}$, which also allows to measure the current density coming from different depths, y, by varying $\theta$. Collectors $c_2$ and the well also collect current coming from the charge carriers generated above and below the area of collection of $c_1$. In this embodiment, the additional collector and the well are used to increase the spatial resolution of the collection segment of $c_1$. The current density is given by the relation $$\vec{J}_e(y) = q \delta_e(y) \mu_e \vec{E}, \quad (4)$$

where q is the electron charge, $\mu_e$ the electron mobility, and $\vec{E}$ the electric field vector. While q and $\mu_e$ are known constants. The topology of the electric field may be extracted from finite element modeling. The angle of $\vec{E}$ is dependent on the geometry of the photodetector and the doping concentrations of the various layers of the structure. Even without the knowledge of $\vec{E}$, from equation (4), a proportionality relationship may be established between $\vec{J}_e(y)$ and $\delta_e(y)$. The shape of $\delta_e(y)$ is representative of the wavelength content of the incoming light signal and of the proportionality between the intensities, $I_{\lambda 1}$ to $I_{\lambda N}$. With proper calibration, the intensities may also be extracted from $\delta_e(y)$ with good accuracy.

Depending on the number of collectors and electrodes employed in the detector, the proposed photodetector finds applications in at least three fields: spectrometry, spectral imaging sensor and color imaging sensor. At least one collector and at least one non-conducting electrode are provided for the various embodiments. In some embodiments, a plurality of collectors are provided, an electrode is provided between each pair of collectors and the well, and an electrode is added after the last collector to reduce the dark current. In this case, the number of electrodes is equal to the number of collectors plus one. Variants of the photodetector topology for each of these applications are described below.

In one embodiment, the photodetector is used as a spectrometer and is made of several charge collectors and electrodes in order to reproduce with high resolution the excess carrier distribution $\delta_e(y)$, as illustrated in FIG. 4. From the curve $\delta_e(y)$, the absorption coefficients of the wavelength content of the incident light are deduced and therefore the light spectrum is obtained.

Figure 9:
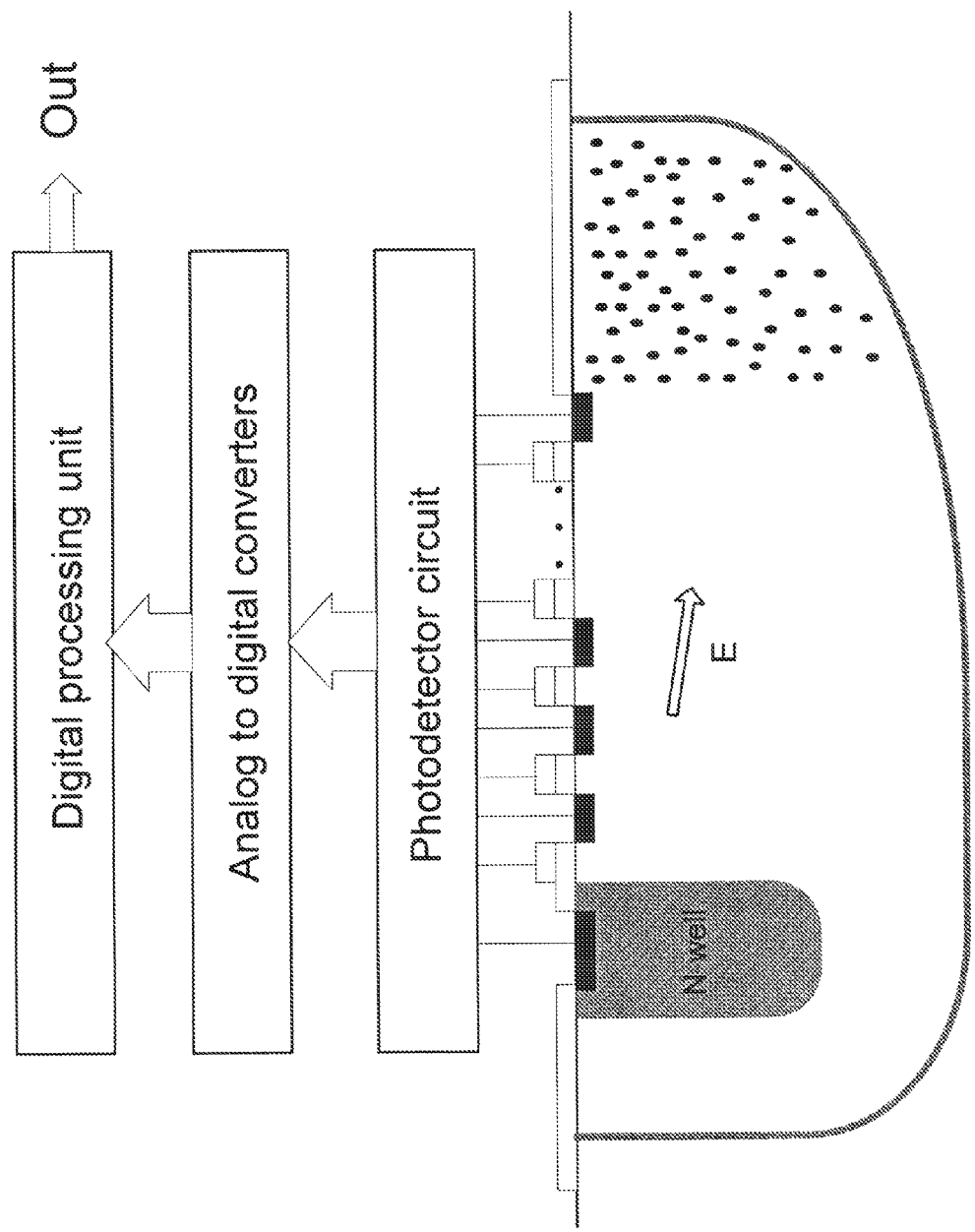
FIG. 9 is an exemplary block diagram of a spectrometer including on-chip electronics, when the whole system is fabricated in a standard CMOS process.

FIG. 9 illustrates an exemplary embodiment for a spectrometer. A photodetector circuit is connected to the photodetector, thereby providing the electronics (or circuitry) for addressing, reading, and generally operating the collectors and the electrodes and the well. Analog to digital converters may be used between the photodetector circuit and a digital processing unit used to extract the wavelengths and/or colors. The photodetector described herein is compatible with the CMOS fabrication process and therefore, the photodetector, signal conditioning and addressing, and data processing can be provided on a same chip. Other external elements, such as flash memory, and input/output devices, may also be present.

For applications where a long chain of collectors and electrodes is not suitable, there is the possibility of using, for instance, two collectors as shown in FIG. 6 and variable electrode voltages $V_{e1}$ and $V_{e2}$. In these conditions, a variation of voltages $V_{e1}$ and $V_{e2}$ changes the electric field orientation, E, towards the collectors, and the collector, $c_1$, will collect charges located at a particular depth that is a function of $V_{e1}$ and $V_{e2}$. Collectors $c_2$ and the well will collect charges located above and below the depth of interest, so that charges collected by $c_1$ are representative of the depth specified by $V_{e1}$ and $V_{e2}$.

By sweeping voltages $V_{e1}$ and $V_{e2}$, the whole distribution $\delta_e(y)$ can be measured with a resolution that is dependent on the voltage resolution of $V_{e1}$ and $V_{e2}$. The ratio of voltages $V_{e1}/V_{e2}$ needed to obtain the proper electric field angles may be determined experimentally. As it is observed with Fourier transforms, as the number of sampled points increases, the resolution of the spectrum also increases.

Figure 7:
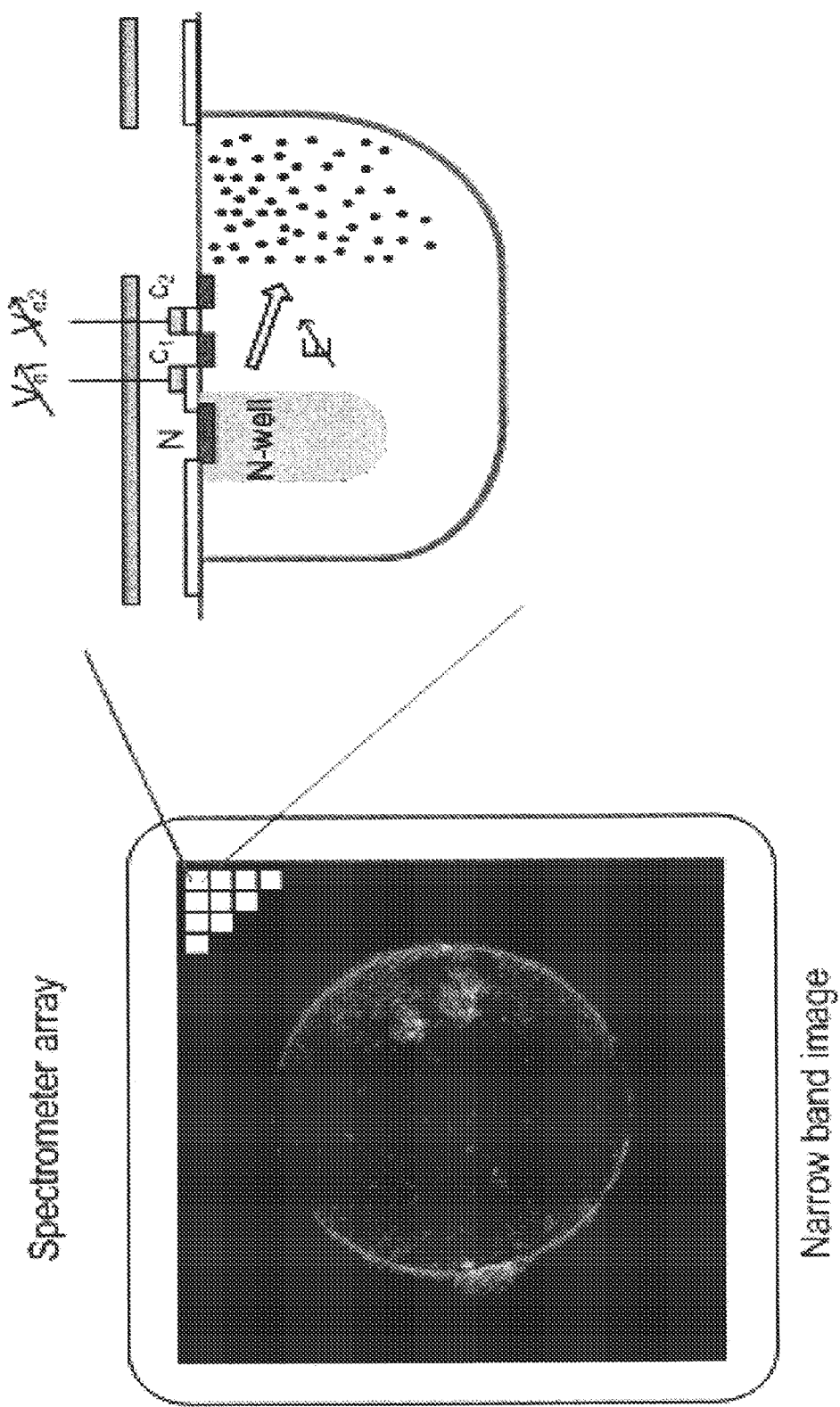
FIG. 7 is an exemplary embodiment of the photodetector of FIG. 4 in an application for a spectral imaging sensor.

In another embodiment, the photodetector is used as a spectral imaging sensor. This application consists of taking a picture of a target with the ability of selecting the wavelength range to be observed. As shown in FIG. 7, the sensor is composed of an array of photodetectors where each of them is acting as a spectrometer. In order to obtain an image with a good resolution on a small size sensor, the photodetector must remain reasonably small, meaning a limited number of collectors and electrodes. Hence, the more compact spectrometer structure of FIG. 6 is used, as illustrated in FIG. 7.

In yet another embodiment, the photodetector is used as a color imaging sensor. This application is aimed at the mass consumer market of digital cameras. One advantage of the proposed sensor compared to the ones currently found in the market is that it does not require any thin film filter to detect the colors. This feature allows for an increase in sensitivity since the full spectrum of the incoming light signal reaches the photo-generation volume and no post-processing thin film deposition is required, making the sensor truly compatible with standard CMOS fabrication processes.

Figure 8:
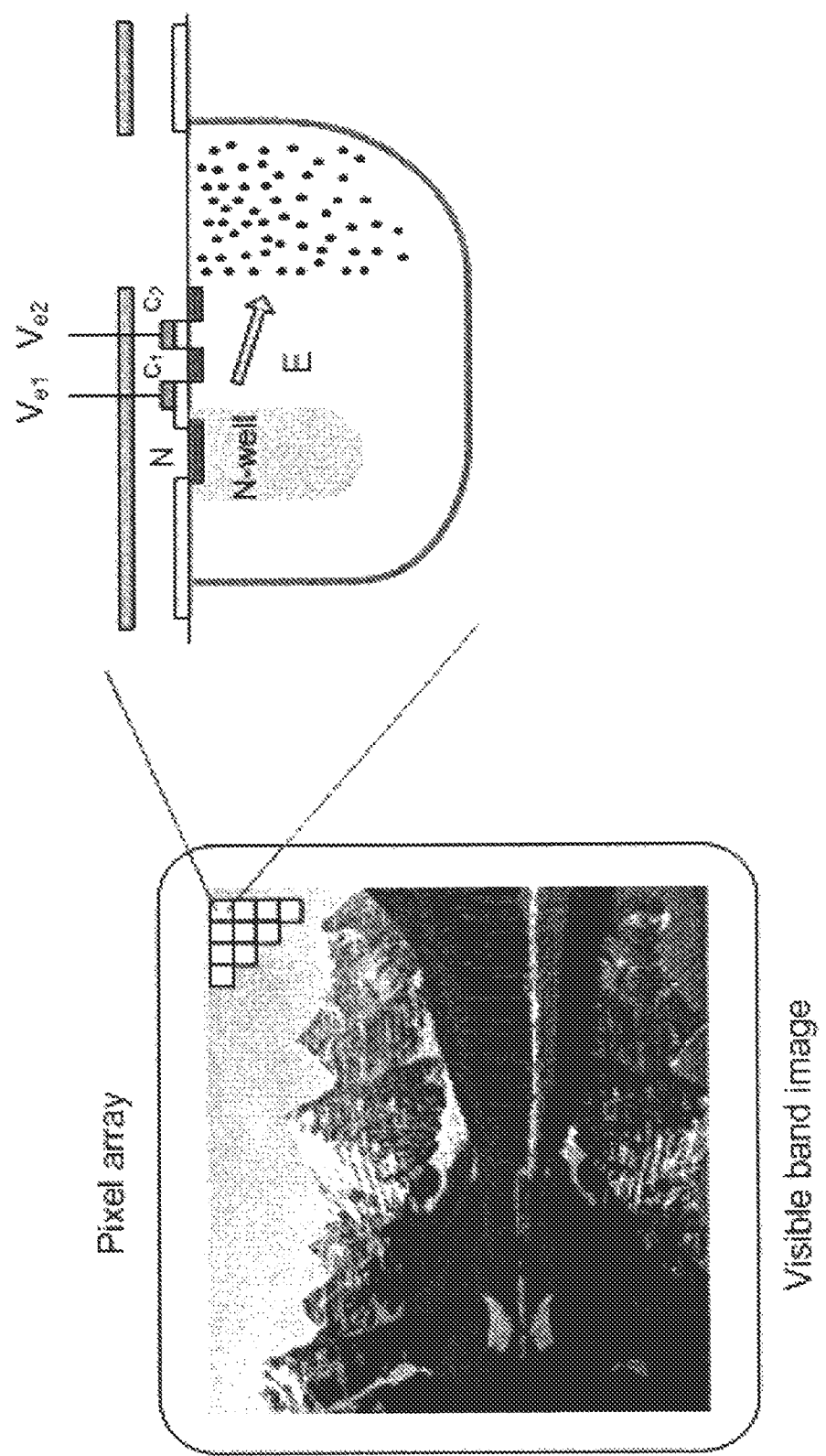
FIG. 8 is an exemplary embodiment of the photodetector of FIG. 5 in an application for a color imaging sensor.

FIG. 8 presents one embodiment of the sensor for color imaging. Since the spectral resolution required to detect colors is relaxed, compared to the spectral imaging application, only two collectors with constant electrode voltages may be used. Having the proper voltages applied on $V_{e1}$ and $V_{e2}$, $c_2$ collects charges generated close to the surface which correspond to the signal's wavelength of the entire visible band. On the other hand, $c_1$ collects charges generated slightly deeper in the substrate that the signal's wavelengths, corresponding to shades of blue, do not reach. Thus, this collector responds to shades of yellow. Finally the well collects charges generated in the vicinity of the deepest limit of the depletion layer. Those charges are generated by the higher limit of the visible spectrum corresponding to shades of red. Proper calibration and linear transformation of the collected signals allow for color recovery into the standard RGB format used by the digital display hardware.

Figure 10:
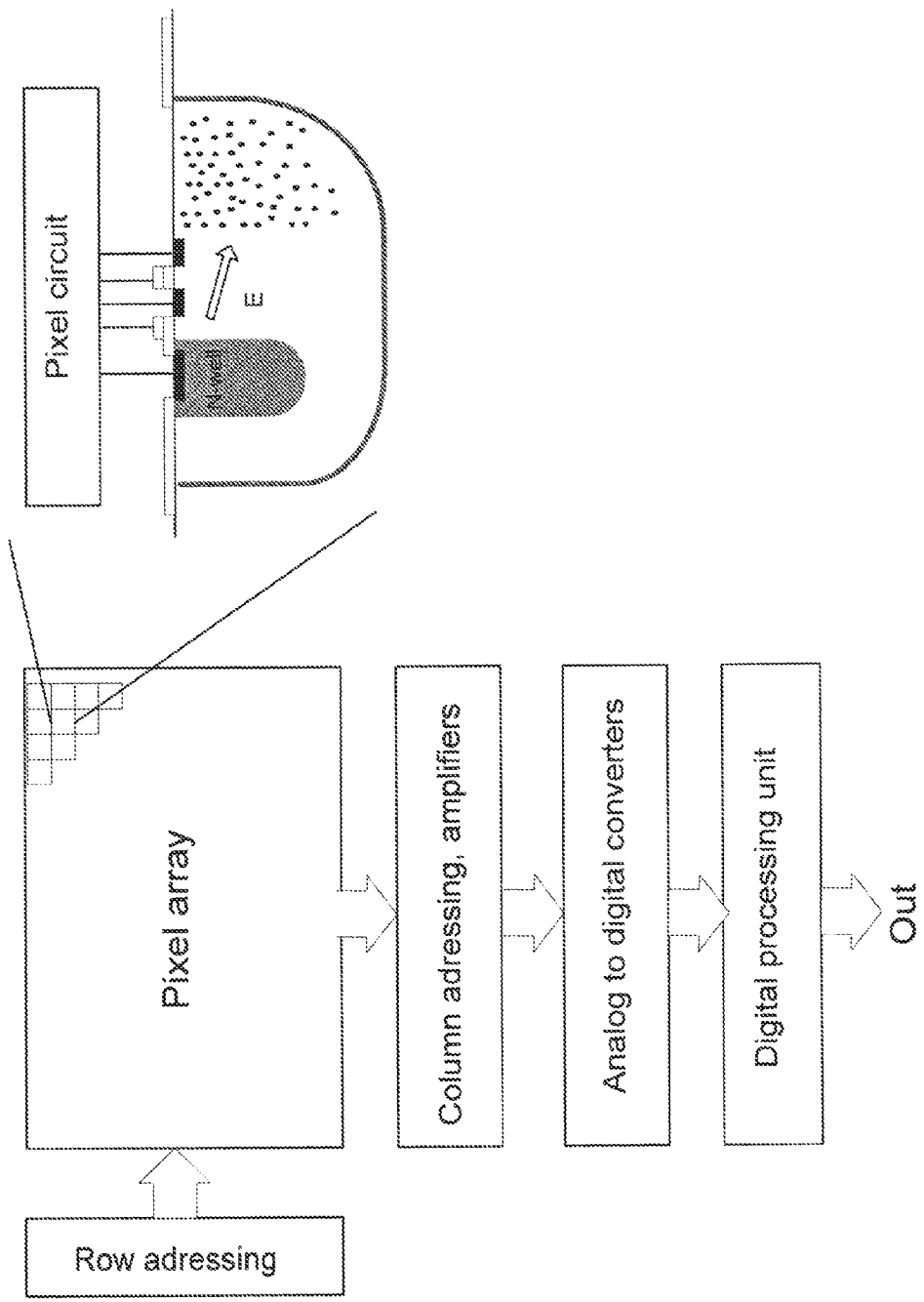
FIG. 10 is an exemplary block diagram of a spectral or color imaging sensor including on-chip electronics, when the whole system is fabricated in a standard CMOS process.

FIG. 10 illustrates an exemplary embodiment for a spectral or color imaging sensor including on-chip electronics. In this example, a pixel array comprises a plurality of photodetectors, and row/column addressing circuitry is used to address each pixel in the array. Various amplifiers may be used to amplify signals that are then converted, using analog to digital converters, to digital signals for the digital processing unit.

The three applications described above, namely spectrometer, spectral imaging sensor and color imaging sensor, rely mainly on the method for photo-generated carrier concentration profiling. These sensors may be completed by various embodiments of electronic circuits inside the pixel and/or surrounding the pixel array. These circuits allow the proper addressing of each pixel and they condition the collectors and well signals through amplifiers, samplers, and analog to digital converters to obtain the right output format for the display hardware. The electronic circuit employed within the pixel may be composed of a conventional MOS source follower, a select, and a reset transistor.

Figure 11:
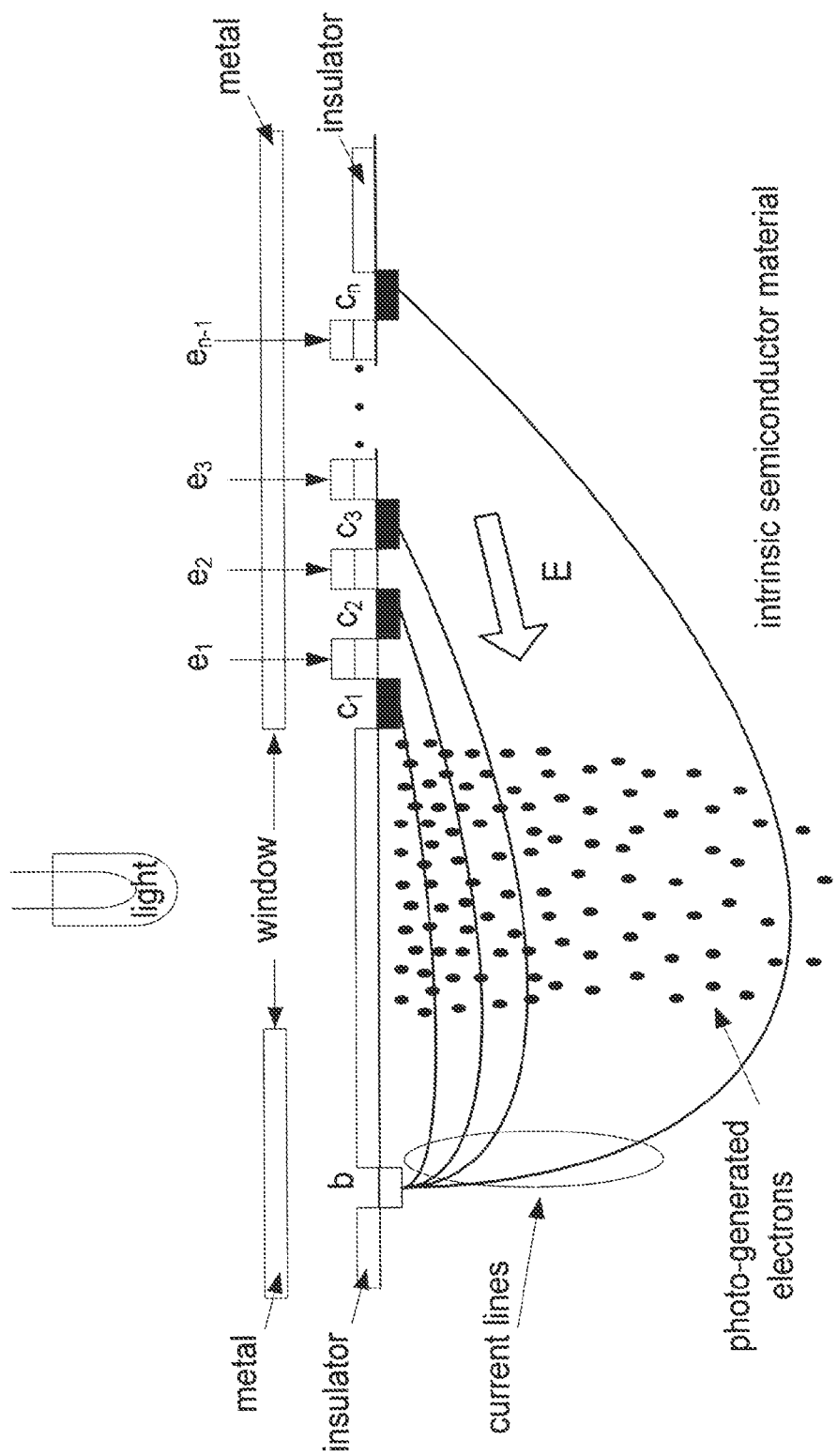
FIG. 11 illustrates an exemplary embodiment of a photodetector fabricated from an intrinsic semiconductor material.

FIG. 11 illustrates another way to obtain the photo-generated carrier concentration as a function of depth, namely by using an intrinsic semiconductor material having a low concentration of defects in order to limit the electron-hole recombination. The electric field required to separate the photo-generated electron-hole pairs and to move the electrons towards the collectors is created by applying a difference of electrical potential between the collectors and the substrate contact, b. Here, depending on the purity of the semiconductor material, the collector implants and the b contact implant can be of the same or the opposite doping type. Voltages on the electrodes can be applied to remove the short circuit effect between collectors, if present, and to adjust the electric field angle with respect to the material surface. If the electronic circuitry required for the spectrometer cannot be fabricated on the same semiconductor material as the photodetector, it is then added externally.

It should be noted that a photodetector could be employed to measure the distribution of hole concentration using the above-described structure, whether using an intrinsic semiconductor material or a depletion region produced by a well. In this case, the doping type of the photodetector structures, presented in FIGS. 3, 4, 6, 7, 8, 9 10, and 11 need to be inverted, whereby P becomes N and vice versa. Also, in the case of the photodetector with intrinsic material of FIG. 11, the substrate contact and the collectors can be of the same doping type P or N.

The embodiments of the invention described above are intended to be exemplary only. The scope of the invention is therefore intended to be limited solely by the scope of the appended claims.

The invention claimed is:

1. A photodetector comprising a semiconductor material having at least a region substantially depleted of free moving carriers, the photodetector comprising:
   a substrate of one of n-type and p-type;
   at least two charge collectors along a surface of the substrate and having a doping-type opposite from the substrate;
   a doped well, in the substrate, of a doping type opposite from the substrate;
   a substrate contact along the surface of the substrate spaced apart from the at least two charge collectors and the doped well to allow current to flow between the at least two charge collectors, the doped well, and the substrate contact; and
   at least two non-conductive electrodes positioned along the surface of the substrate in an alternating sequence with the at least two charge collectors and the doped well to counter a diminished potential barrier between adjacent ones of the at least two charge collectors, a first of the at least two non-conductive electrodes positioned between the at least two charge collectors and a second of the at least two non-conductive electrodes positioned between one of the at least two charge collectors and the doped well, the non-conductive electrodes separated from the substrate by an insulator, and adapted to apply an electric potential to the substrate and cause charge carriers generated therein by application of a light source to advance towards the at least two charge collectors due to the effects of an electric field, such that the at least two charge collectors can measure carrier concentration within the substrate.

2. The photodetector of claim 1, wherein the at least two non-conductive electrodes are adapted to apply a fixed electric potential to the substrate to measure a given carrier concentration at each one of the at least two charge collectors.

3. The photodetector of claim 1, wherein the at least two non-conductive electrodes are adapted to apply a varying electric potential to the substrate to measure multiple carrier concentrations at each one of the at least two charge collectors.

4. The photodetector of claim 1, wherein the photodetector is comprised in a spectrometer comprising:
   a photodetector circuit connected to the photodetector for addressing, reading, and operating the at least two charge collectors and the at least two non-conductive electrodes;
   an analog to digital circuit to convert carrier concentration measurements to digital signals; and
   a digital processing unit to extract at least one of wavelengths and colors from the digital signals.

5. The photodetector of claim 1, wherein the photodetector is comprised in a spectral imaging sensor comprising:
   an array of the photodetectors, wherein varying electric potentials are applied to the at least two non-conductive electrodes;
   a photodetector circuit connected to the array of photodetectors for addressing, reading, and operating the at least two charge collectors and the at least two non-conductive electrodes of each photodetector;
   an analog to digital circuit to convert carrier concentration measurements to digital signals; and
   a digital processing unit to extract at least one of wavelengths and colors from the digital signals.

6. The photodetector of claim 1, wherein the photodetector is comprised in a color image sensor comprising:
   an array of the photodetectors, wherein constant electric potentials are applied to the at least two non-conductive electrodes;
   a photodetector circuit connected to the photodetector for addressing, reading, and operating the at least two charge collectors and the at least two non-conductive electrodes of each photodetector;

an analog to digital circuit to convert carrier concentration measurements to digital signals; and a digital processing unit to extract colors from the digital signals and convert the colors to an RGB format.

7. A photodetector comprising:

a substrate made from an intrinsic semiconductor material having a low concentration of defects;

at least three charge collectors along a surface of the substrate;

a substrate contact along the surface of the substrate spaced apart from the at least three charge collectors to allow current to flow between the at least three charge collectors and the substrate contact; and at least two non-conductive electrodes positioned along the surface of the substrate in an alternating sequence with the at least three charge collectors to counter a diminished potential barrier between adjacent ones of the at least three charge collectors, each pair of charge collector having a non-conductive electrode therebetween, the non-conductive electrodes separated from the substrate by an insulator, and adapted to apply an electric potential to the substrate and cause charge carriers generated therein by application of a light source to advance towards the at least three charge collectors due to the effects of an electric field, such that the at least three charge collectors can measure carrier concentration within the substrate.

8. The photodetector of claim 7, wherein the substrate contact is of a same doping type as the at least three charge collectors.

9. The photodetector of claim 7, wherein the at least two non-conductive electrodes are adapted to apply a fixed electric potential to the substrate to measure a given carrier concentration at each one of the at least three charge collectors.

10. The photodetector of claim 7, wherein the at least two non-conductive electrodes are adapted to apply a varying electric potential to the substrate to measure multiple carrier concentrations at each one of the at least three charge collectors.

* * * * *